(12) United States Patent
Ariyoshi

(10) Patent No.: US 7,218,162 B2
(45) Date of Patent: May 15, 2007

(54) SEMICONDUCTOR INTEGRATED CIRCUIT HAVING OUTPUT CIRCUIT

(75) Inventor: Ryuji Ariyoshi, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 11/340,697

(22) Filed: Jan. 27, 2006

(65) Prior Publication Data

US 2006/0170477 A1    Aug. 3, 2006

(30) Foreign Application Priority Data

Jan. 31, 2005    (JP) .............................. 2005-023376

(51) Int. Cl.
*H03H 11/26*    (2006.01)
*H03K 3/356*    (2006.01)

(52) U.S. Cl. ...................................... 327/272; 327/210

(58) Field of Classification Search ................ 327/264, 327/272, 278, 281, 285, 334, 336, 565, 80, 327/206, 210; 315/72, 127, 159, 209 R
See application file for complete search history.

(56) References Cited

U.S. PATENT DOCUMENTS 7,005,906 B2 *    2/2006    Miyamoto et al. ........... 327/293
7,023,237 B2 *    4/2006    Sakata et al. .................. 326/34
7,053,670 B2 *    5/2006    Muto et al. .................... 327/65
7,106,108 B2 *    9/2006    Igeta et al. .................. 327/100

FOREIGN PATENT DOCUMENTS

JP    A 04-162824    6/1992
JP    A 07-249979    9/1995

* cited by examiner

*Primary Examiner*—Shih-Ohao Chen
*Assistant Examiner*—Minh Dieu A
(74) *Attorney, Agent, or Firm*—Oliff & Berridge, PLC

(57) ABSTRACT

A semiconductor integrated circuit that has an output circuit in which an output-stage operating voltage lower than a power supply voltage is applied to an output stage is provided. Even when the power supply voltage is lowered, a sufficient output signal amplitude can be obtained. An increase in circuit scale can be prevented and the power consumption can be reduced. An output-stage operating voltage supply source, including an N-channel MOS transistor having a first threshold voltage, applies an operating voltage lower than a power supply voltage to the output stage of the output circuit. A drive-circuit operating voltage supply source, including an N-channel MOS transistor having a second threshold voltage lower than the first threshold voltage, applies a drive-circuit operating voltage higher than the output-stage operating voltage to a drive circuit.

13 Claims, 4 Drawing Sheets

SEMICONDUCTOR INTEGRATED CIRCUIT HAVING OUTPUT CIRCUIT

CROSS-REFERENCE TO RELATED APPLICATION

Exemplary embodiments of this invention were first described in and claim priority from Japanese Application No. 2005-023376, which is incorporated by reference in its entirety.

BACKGROUND

Exemplary embodiments of this invention relate to semiconductor integrated circuits each having an output circuit. More particularly, exemplary embodiments of this invention relate to a semiconductor integrated circuit having an output circuit that outputs a signal with a smaller amplitude than a power supply voltage and that consumes less electricity.

Semiconductor integrated circuits use various output circuits according to respective purposes of the integrated circuits. For example, reference 1 (JP 4-162824) and reference 2 (JP 7-249979) disclose output circuits, each of which is used in a CMOS logic integrated circuit. In each output circuit, two N-channel MOS (NMOS) transistors are connected in series between a power supply Vdd of the corresponding integrated circuit and ground (GND), and the middle point between the transistors serves as an output terminal.

Disadvantageously, when this type of output circuit is used as an output circuit for a CMOS logic integrated circuit, a high level of an output signal does not reach a power supply voltage Vdd. In other words, when the gate voltage of the NMOS transistor connected to the power supply Vdd is increased to a power supply voltage level Vdd, a voltage at the output terminal is increased to a value of Vdd−(Vt+ΔVt). Here, Vt denotes a threshold voltage in a state where the potential of the source of the NMOS transistor is equal to that of the corresponding substrate, and ΔVt denotes a variation in threshold voltage caused when the potential of the source differs from that of the substrate. For example, if the threshold voltage Vt is equal 0.7 V, then the value of Vt+ΔVt is approximately equal to 1 V.

The references 1 and 2 disclose techniques to overcome the above-mentioned disadvantage.

FIG. 4 shows an example of the output circuit disclosed in reference 1. As shown in FIG. 4, an output circuit 120 includes two output NMOS transistors 122 and 124 connected in series between a power supply Vdd and GND. The middle point between the transistors serves as an output terminal OUT. According to reference 1, a threshold voltage of the pull-up NMOS transistor 122 (directly connected to the power supply Vdd) is lower than that of the pull-down NMOS transistor 124 (directly connected to the GND). Thus, a high-level output signal can be maintained at a high level.

FIG. 5 shows an example of the output circuit disclosed in reference 2. As shown in FIG. 5, an output circuit 130 includes two output NMOS transistors 132 and 134 connected in series between a power supply Vdd and the GND. The middle point between the transistors serves as an output terminal OUT. The output circuit 130 further includes a booster circuit 138 for boosting a power supply voltage to be applied to a CMOS gate 136 that drives the NMOS transistor 132 that is directly connected to the power supply Vdd. Consequently, the gate voltage of the output transistor directly connected to the power supply is increased to a high level corresponding to the boosted voltage, so that an output level is equal to the power supply voltage.

For example, a temperature compensated crystal oscillator (TCXO), used to generate a reference frequency for communication equipment, requires an output signal with an amplitude of, e.g., approximately 1 V that is lower than a power supply voltage.

A related TCXO uses an output circuit as shown in, for example, FIG. 6. As shown in FIG. 6, an output circuit 140 is constructed such that an operating voltage applied to two output-stage NMOS transistors is lower than a power supply voltage Vdd of an integrated circuit to reduce the amplitude of an output signal. The output circuit 140 includes three NMOS transistors 146, 142, and 144 that are connected in series, in this order, between a power supply Vdd and GND. The three NMOS transistors 142, 144, and 146 have the same positive threshold voltage.

The NMOS transistors, excluding the NMOS transistor 146, are directly connected to the power supply Vdd. The first and second NMOS transistors 142 and 144 correspond to the above-mentioned output transistors 122 and 124 in the circuit shown in FIG. 4, and alternatively, correspond to the transistors 132 and 134 in the circuit shown in FIG. 5, respectively. The middle point between the first and second NMOS transistors 142 and 144 serves as an output terminal OUT. A pull-up drive circuit 154 is connected to the gate of the output transistor 142, and a pull-down drive circuit 156 is connected to the gate of the output transistor 144. Each of the pull-up drive circuit 154 and the pull-down drive circuit 156 include a plurality of CMOS gates, i.e., inverters.

On the other hand, the third NMOS transistor 146 serves as an output-stage operating voltage supply source for applying an output-stage operating voltage Vdd1 to the output transistors 142 and 144. In other words, the power supply voltage Vdd is applied to the drain of the NMOS transistor 146 and a reference voltage Vr1 is applied from a reference voltage source 150 to the gate thereof. The source of the NMOS transistor 146 provides a low voltage that is lower than the reference voltage Vr1 by an amount obtained by adding a variation ΔVt in threshold voltage, caused by the potential difference between the substrate and the source, to a threshold voltage Vt of the transist or 146 in a state where the potential of the substrate is equal to that of the source. Therefore, the voltage Vdd1 (=Vr1−(Vt+ΔVt)) is applied as an output-stage operating voltage to the output transistors 142 and 144.

The power supply voltage Vdd can also be applied as it is to the pull-up drive circuit 154. Consequently, the gate voltage of the first NMOS transistor 142, serving as a pull-up output transistor, can be increased to a higher level than the operating voltage Vdd1, that is applied to the drain of the NMOS transistor 142 in the same way as in the output circuit according to reference 2. Therefore, an output signal has an amplitude that depends on the reference voltage Vr1, the threshold voltage Vt of the third NMOS transistor 146, and the variation ΔVt in threshold voltage. The output signal is approximately equal to the output-stage operating voltage Vdd1.

SUMMARY

In the circuit shown in FIG. 6, although the amplitude of the output signal is lower than the power supply voltage Vdd, the amplitude of each of output signals of the drive circuits 154 and 156 is equal to the power supply voltage Vdd. Disadvantageously, the power consumption is high. The inventor of the present application has studied an output circuit, as shown in FIG. 7.

In an output circuit 160 shown in FIG. 7, an output-stage operating voltage Vdd1 is applied to output transistors 142 and 144 in the same way as in the output circuit shown in FIG. 6. The output-stage operating voltage Vdd1 is determined by a reference voltage Vr1 that is generated by a first reference voltage source 150, a threshold voltage Vt of a third NMOS transistor 146, and a variation ΔVt in threshold voltage. The output-stage operating voltage Vdd1 is lower than a power supply voltage Vdd. In addition, a drive-circuit operating voltage Vdd2 that is lower than the power supply voltage Vdd is applied to drive circuits 154 and 156. Thus, the power consumption of each drive circuit can be reduced.

In other words, a drive-circuit operating voltage supply source, including a fourth NMOS transistor 162, applies the operating voltage Vdd2 to the drive circuits 154 and 156. The power supply voltage Vdd is applied to the drain of the fourth NMOS transistor 162 and a second reference voltage Vr2 is applied from a second reference voltage source 152 to the gate thereof. The NMOS transistor 162 has the same threshold voltage Vt as that of the third NMOS transistor 146. The source of the NMOS transistor 162 provides the drive-circuit operating voltage Vdd2 which is equal to (Vr2−(Vt+ΔVt)).

Specifically, the second reference voltage Vr2 is higher than the first reference voltage Vr1, so that the drive-circuit operating voltage Vdd2 is higher than the output-stage operating voltage Vdd1. Consequently, an output signal with an amplitude that is approximately equal to the output-stage operating voltage Vdd1 can be obtained in a manner similar to the output circuit shown in FIG. 6. Compared to the output circuit shown in FIG. 6, however, the output circuit shown in FIG. 7 requires the second reference voltage source 152 and the fourth NMOS transistor 162, thus resulting in an increase in circuit scale.

If the second reference voltage source 152 is omitted and the first reference voltage Vr1 is applied from the first reference voltage source 150 to the gate of the fourth NMOS transistor 162, the drive-circuit operating voltage Vdd2 applied to the drive circuits is equal to the output-stage operating voltage Vdd1. In this case, as described in reference 2, an output signal level is not increased to the output-stage operating voltage Vdd1. In other words, the amplitude of an output signal is lower than the output-stage operating voltage Vdd1.

As described above, the output circuits shown in FIG. 6 and FIG. 7 are intended to provide an output signal with an amplitude that is lower than the power supply voltage Vdd. Therefore, when the power supply voltage Vdd is far higher than desired output signal amplitude, the output signal amplitude may be lower than the output-stage operating voltage Vdd1 as mentioned above. However, the power supply voltage Vdd has been recently lowered due to the miniaturization of devices. When the output-stage operating voltage is lower than the power supply voltage and the output signal amplitude is further lower than the output-stage operating voltage, it is difficult to provide the necessary amplitude of an output signal.

Further, the technique disclosed in reference 1 may be used. In other words, the threshold voltage of the pull-up output transistor 142 is lower than that of the pull-down output transistor 144.

However, the reduction of the threshold voltage of the pull-up output transistor 142 is actually limited. Therefore, when the drive-circuit operating voltage Vdd2 that is equal to the output-stage operating voltage Vdd1 is applied to the drive circuits 154 and 156, even when the threshold voltage of the pull-up output transistor 142 is reduced, the amplitude of an output signal cannot be increased to the output-stage operating voltage Vdd1.

Accordingly, an exemplary embodiment of the present invention is to overcome the above-mentioned disadvantages. In other words, an exemplary embodiment of the present invention is to provide a semiconductor integrated circuit having an output circuit including an output stage that is supplied with an output-stage operating voltage that is lower than a power supply voltage of the integrated circuit. According to the exemplary embodiment of the present invention, even when the power supply voltage is lowered, sufficient output signal amplitude is obtained, an increase in circuit scale can be prevented, and the power consumption can be reduced.

In order to overcome the above-mentioned disadvantages, an exemplary embodiment of the present invention provides a semiconductor integrated circuit that operates with a power-supply voltage and includes an output circuit. The output circuit may include: a driving circuit that receives an input signal and generates a driving signal and an inverted drive signal, the driving circuit including an CMOS gate that operates with a driving circuit operating voltage lower than the power-supply voltage and outputs the driving signal; an output stage having an output terminal that outputs an output signal, the output stage including a first and a second N-channel MOS transistor, the first N-channel MOS transistor having a drain thereof that receives an output stage operating voltage lower than the driving circuit operating voltage, a source thereof connected to the output terminal, and a gate thereof that receives the driving signal, the second N-channel MOS transistor having a source thereof connected to a ground, a drain thereof connected to the output terminal, and a gate thereof that receives the inverted driving signal; an output stage operating voltage source that supplies the output stage operating voltage, the output stage operating voltage source including a third N-channel MOS transistor having a first positive threshold voltage, the third N-channel MOS transistor further having a drain thereof that receives the power-supply voltage, a gate thereof that receives a reference voltage, and a source thereof that outputs the output stage operating voltage; and a driving circuit operating voltage source that supplies the driving circuit operating voltage, the driving circuit operating voltage source including a fourth N-channel MOS transistor having a second threshold voltage lower than the first threshold voltage, the fourth N-channel MOS transistor further having a drain thereof that receives the power-supply voltage, a gate thereof that receives the reference voltage, and a source thereof that outputs the driving circuit power supply voltage.

In order to overcome the above-mentioned disadvantages, an exemplary embodiment of the present invention provides a semiconductor integrated circuit. The semiconductor integrated circuit may include: an oscillator circuit that operates with an oscillator circuit operating voltage lower than the power-supply voltage and outputs an oscillation signal; an oscillator circuit operating voltage source that receives a reference voltage and supplies the oscillation circuit operating voltage; a driving circuit that receives the oscillation signal and generates a driving signal and an inverted drive signal the driving circuit including an CMOS gate that operates with a driving circuit operating voltage lower than the power-supply voltage and outputs the driving signal; an output stage having an output terminal that outputs an output signal the output stage including a first and a second N-channel MOS transistor, the first N-channel MOS transistor having a drain thereof that receives an output stage operating voltage lower than the driving circuit operating voltage, a source thereof connected to the output terminal, and a gate thereof that receives the driving signal, the second N-channel MOS transistor having a source thereof connected to a ground, a drain thereof connected to the output terminal, and a gate thereof that receives the inverted driving signal; an output stage operating voltage source that supplies the output stage operating voltage, the output stage operating voltage source including a third N-channel MOS transistor having a first positive threshold voltage, the third N-channel MOS transistor further having a drain thereof that receives the power-supply voltage, a gate thereof that receives the reference voltage, and a source thereof that outputs the output stage operating voltage; and a driving circuit operating voltage source that supplies the driving circuit operating voltage, the driving circuit operating voltage source including a fourth N-channel MOS transistor having a second threshold voltage lower than the first threshold voltage, the fourth N-channel MOS transistor further having a drain thereof that receives the power-supply voltage, a gate thereof that receives the reference voltage, and a source thereof that outputs the driving circuit power supply voltage.

In order to overcome the above-mentioned disadvantages, an exemplary embodiment of the present invention provides a semiconductor integrated circuit that operates with a power-supply voltage and includes an output circuit. The output circuit may include: a driving circuit that receives an input signal and generates a driving signal and an inverted drive signal, the driving circuit including an CMOS gate that operates with a driving circuit operating voltage and outputs the driving signal; an output stage having an output terminal that outputs an output signal, the output stage including a first and a second N-channel MOS transistor, the first N-channel MOS transistor having a drain thereof that receives an output stage operating voltage, a source thereof connected to the output terminal, and a gate thereof that receives the driving signal, the second N-channel MOS transistor having a source thereof connected to a ground, a drain thereof connected to the output terminal, and a gate thereof that receives the inverted driving signal, wherein: an amplitude of the output signal is reduced by supplying the output stage operating voltage lower than the power-supply voltage from an output stage operating voltage source to the output stage, the output stage operating voltage source including a third N-channel MOS transistor having a first positive threshold voltage, the third N-channel MOS transistor having a drain thereof that receives the power-supply voltage, a gate thereof that receives a reference voltage, and a source thereof that outputs the output stage operating voltage; and an excessive reduction of the amplitude of the output signal is prevented by supplying the driving circuit operating voltage lower than the power-supply voltage but higher than the output stage operating voltage from a driving circuit operating voltage source to the driving circuit, the driving circuit operating voltage source including a fourth N-channel MOS transistor having a second threshold voltage lower than the first threshold voltage, the fourth N-channel MOS transistor having a drain thereof that receives the power-supply voltage, a gate thereof that receives the reference voltage, and a source thereof that outputs the driving circuit power supply voltage.

Since the drive-circuit operating voltage, which is higher than the output-stage operating voltage, is applied to the CMOS gates for outputting a drive signal to the gate of the first N-channel MOS transistor, the gate voltage of the first N-channel MOS transistor can be higher than the drain voltage thereof. Thus, a reduction in output signal amplitude can be prevented. In addition, since the drive-circuit operating voltage applied to the CMOS gates is lower than the power supply voltage, the power consumption of the drive circuits can be reduced. Furthermore, the reference voltage, which is applied to the output-stage operating voltage supply source, is also applied commonly as a drive-circuit operating voltage to the drive-circuit operating voltage supply source including the fourth N-channel MOS transistor having a low threshold voltage. Thus, an increase in circuit scale can be prevented.

According to various exemplary embodiments, the first N-channel MOS transistor has a third threshold voltage which is lower than the threshold voltage of the second N-channel MOS transistor.

The drive-circuit operating voltage may be higher than the output-stage operating voltage and the threshold voltage of the first N-channel MOS transistor may be lowered, so that a reduction in output signal amplitude can be further prevented.

According to various exemplary embodiments, the second and the third threshold voltages are equal, and the second and the third threshold voltages are one-half of the first threshold voltage or lower. In addition, the third threshold voltage may be equal to or higher than 0 V.

According to various exemplary embodiments, the circuit further includes: an oscillating-circuit operating voltage supply source that receives the reference voltage and generates an oscillating-circuit operating voltage; and an oscillating circuit that receives the oscillating-circuit operating voltage and supplies an oscillation signal to the input terminal of the output circuit.

In other words, the same reference voltage may be applied to the oscillating-circuit operating voltage supply source in addition to the output-stage operating voltage supply source and the drive-circuit operating voltage supply source, thus further preventing an increase in circuit scale.

In the semiconductor integrated circuit according to various exemplary embodiments of the present invention, an increase in circuit scale can be prevented, the power consumption can be reduced, and even when a power supply voltage is lowered, a sufficient output signal amplitude can be provided.

DETAILED DESCRIPTION OF EMBODIMENTS

Figure 1:
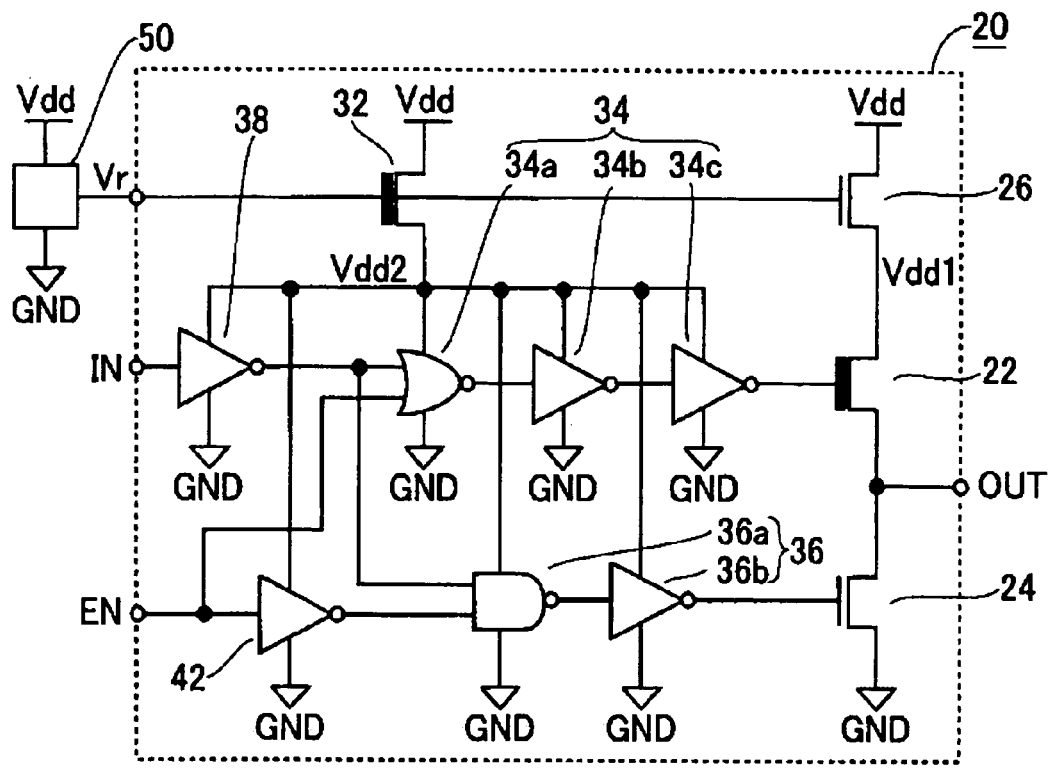
FIG. 1 shows an example of an output circuit constituting a semiconductor integrated circuit according to an exemplary embodiment of the present invention.

FIG. 1 shows an example of an output circuit 20 of a semiconductor integrated circuit according to an exemplary embodiment of the present invention.

Figure 6:
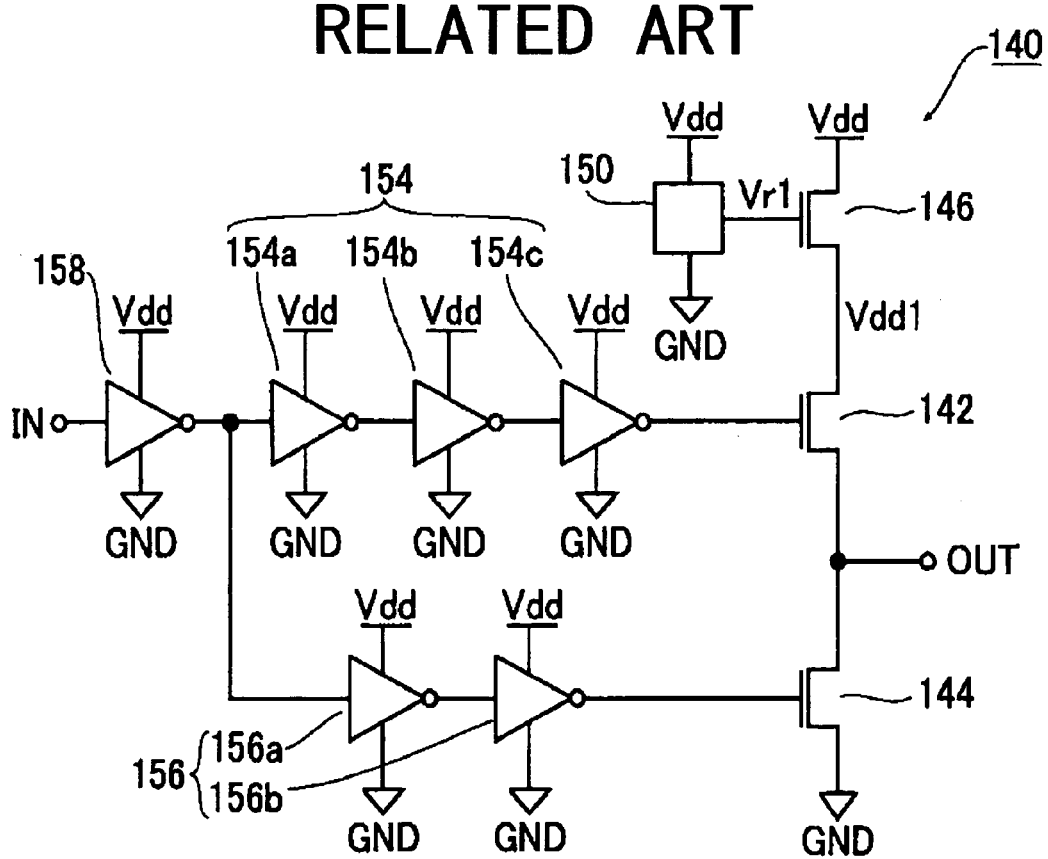
FIG. 6 shows an example of an output circuit of a related art for a temperature compensated crystal oscillator (TCXO)

Referring to FIG. 1, the output circuit 20 has three NMOS transistors 26, 22, and 24, that are connected in series, in this order, between a power supply Vdd and ground (GND). A power supply voltage Vdd is applied to an integrated circuit 10 in a manner similar to the related output circuits 140 and 160 shown in FIG. 6 and FIG. 7. The drain of the third NMOS transistor 26 is connected to the power supply Vdd, and the source thereof is connected to the drain of the first NMOS transistor 22. The source of the first NMOS transistor 22 is connected to an output terminal OUT, and the gate thereof is connected to the output of a pull-up drive circuit 34. The drain of the second NMOS transistor 24 is connected to the output terminal OUT, the source thereof is connected to GND, and the gate thereof is connected to the output of a pull-down drive circuit 36.

According to various exemplary embodiments, the first NMOS transistor 22 functions as a pull-up output transistor and the second NMOS transistor 24 functions as a pull-down output transistor. The third NMOS transistor 26 functions as an output-stage operating voltage supply source for applying an output-stage operating voltage to those output transistors. In other words, the power supply voltage Vdd is applied to the drain of the third NMOS transistor 26 and a reference voltage Vr is applied from a reference voltage source 50 to the gate thereof. An output-stage operating voltage Vdd1, which is lower than the power supply voltage Vdd, is applied from the source of the third NMOS transistor 26 to the drain of the first NMOS transistor 22, serving as the pull-up output transistor.

According to various exemplary embodiments, each of the second and third NMOS transistors 24 and 26 have a first threshold voltage Vt1. The first NMOS transistor 22 has a second threshold voltage Vt2 that is lower than the first threshold voltage Vt1. Specifically, when the source of each transistor has the same potential as that of the substrate, the first threshold voltage Vt1 is approximately equal to 0.7 V and the second threshold voltage Vt2 is approximately equal to 0.1 V.

The threshold voltage of a MOS transistor generally depends on various measuring conditions. In particular, as mentioned above, it is known that the threshold voltage of the MOS transistor depends on the potential difference between the source and the substrate. Therefore, a simply described "threshold voltage" normally means a threshold voltage obtained on condition that the source of the transistor has the same potential as that of the corresponding substrate. In the present specification, a simply described "threshold voltage" also means a threshold voltage obtained on condition that the source of the transistor has the same potential as that of the substrate according to the normal case.

The exemplary pull-up drive circuit 34 has three CMOS gates, i.e., one NOR gate 34a and two inverters 34b and 34c connected in series, in this order. An input signal supplied to an input terminal IN is supplied to one input terminal of the NOR gate 34a at a first stage through an inverter 38. The pull-up drive circuit 34 outputs a drive signal that is in phase with the input signal to the gate of the pull-up output transistor 22.

The exemplary pull-down drive circuit 36 includes two CMOS gates, i.e., one NAND gate 36a and one inverter 36b connected in series, in this order. The input signal that is supplied to the input terminal IN is also supplied to one input terminal of the NAND gate 36a at a first stage through the inverter 38. The pull-down drive circuit 36 outputs a signal that has a reversed phase compared with the input signal to the gate of the pull-down output transistor 24.

In other words, the pull-down drive circuit 36 generates an inverted drive signal that has a reversed phase compared with a drive signal to be supplied to the gate of the pull-up output transistor 22, and supplies the signal to the gate of the pull-down output transistor 24.

Referring to FIG. 1, the output circuit 20 has an enable terminal EN. An enable signal that is supplied to the enable terminal EN is also supplied to the other input terminal of the NOR gate 34a at the first stage of the pull-up drive circuit 34. The enable signal is also supplied to the other input terminal of the NAND gate 36a at the first stage of the pull-down drive circuit 36 through an inverter 42. Accordingly, when the enable signal is at a high level, the output of the pull-up drive circuit 34 and that of the pull-down drive circuit 36 are fixed to a low level. Consequently, the output transistors 22 and 24 are turned off, so that the output terminal OUT enters a high impedance state.

An exemplary drive-circuit operating voltage supply source, including a fourth NMOS transistor 32, applies a drive-circuit operating voltage to each of the drive circuits 34 and 36 and the inverters 38 and 42. In other words, the power supply voltage Vdd is applied to the drain of the fourth NMOS transistor 32, the reference voltage Vr is applied to the gate thereof, and a drive-circuit operating voltage Vdd2 is applied from the source thereof to the drive circuits 34, 36 and the inverters 38, 42.

The fourth exemplary NMOS transistor 32, serving as the drive-circuit operating voltage supply source, is supplied with the same reference voltage Vr as that was applied to the third NMOS transistor 26. The third NMOS transistor 26 serves as the output-stage operating voltage supply source, from the same reference voltage source 50. The fourth NMOS transistor 32 has the threshold voltage Vt2 that is lower than the threshold voltage Vt1 of the third NMOS transistor 26.

Figure 7:
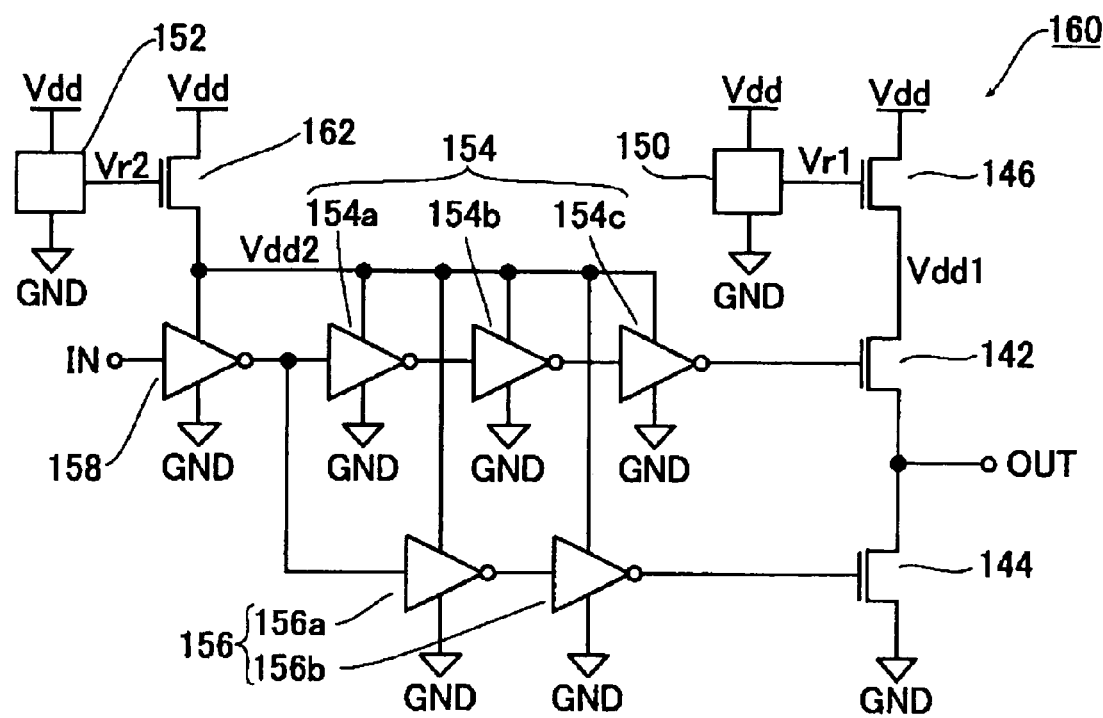
FIG. 7 shows an exemplary output circuit studied by the inventor of the present invention.

The exemplary output circuit 20 shown in FIG. 1 has a similar structure as that of the output circuit shown in FIG. 7, except that the enable terminal EN is further arranged and the NOR gate 34a and the NAND gate 36a are arranged at the first stages of the drive circuits 34 and 36, respectively, in order to ensure a high impedance output state. However, the output circuit 20 differs from the output circuit shown in FIG. 7 as follows.

First, the fourth NMOS transistor 32, serving as the drive-circuit operating voltage supply source, is supplied with the same reference voltage Vr as that is applied to the gate of the third NMOS transistor 26. The third NMOS transistor 26 serves as the output-stage operating voltage supply source. Therefore, the output circuit 20 shown in FIG. 1 requires only one reference voltage source 50. Thus, the circuit scale of the output circuit 20 is smaller than the output circuit 160 shown in FIG. 7, which needs the two reference voltage sources 150 and 152.

In addition, the fourth exemplary NMOS transistor 32, serving as the drive-circuit operating voltage supply source, has the second threshold voltage Vt2 that is lower than the first threshold voltage Vt1 of the third NMOS transistor 26. The third NMOS transistor 26 serves as the output-stage operating voltage supply source. Accordingly, in spite of the use of the same reference voltage Vr, the fourth NMOS transistor 32 can provide the higher drive-circuit operating voltage Vdd2 than the output-stage operating voltage Vdd1.

Specifically, the output-stage operating voltage Vdd1 provided by the output-stage operating voltage supply source, includes the third NMOS transistor 26. The drive-circuit operating voltage Vdd2 provided by the drive-circuit operating voltage supply source, includes the fourth NMOS transistor 32, can be expressed by the following expressions, respectively:

$$Vdd1 = Vr - (Vt1 + \Delta Vt1); \text{ and}$$

$$Vdd2 = Vr - (Vt2 + \Delta Vt2),$$

where, Vt1 denotes the threshold voltage of the third NMOS transistor 26, Vt2 denotes the threshold voltage of the fourth NMOS transistor 32, ΔVt1 denotes a variation in threshold voltage of the third NMOS transistor 26, and ΔVt2 denotes a variation in threshold voltage of the fourth NMOS transistor 32. The threshold voltages being obtained on condition that the source potential and the substrate potential are equal, and the variations being caused when the source potential differs from the substrate potential in the use of those transistors in the circuit shown in FIG. 1.

For the sake of simplicity, the difference between ΔVt1 and ΔVt2 may be ignored. The drive-circuit operating voltage Vdd2 is higher than the output-stage operating voltage Vdd1 by the difference between the threshold voltage Vt1 of the third NMOS transistor 26 and the threshold voltage Vt2 of the fourth NMOS transistor 32, i.e., Vt1−Vt2. The higher drive-circuit operating voltage Vdd2 can be applied to the drive circuits 34 and 36.

The CMOS gate (inverter 34c) that is capable of increasing an output terminal voltage to a level that is approximately equal to the operating voltage is arranged at least at the final stage of the pull-up drive circuit 34. Therefore, the drive signal to be supplied from the pull-up drive circuit 34 to the gate of the first NMOS transistor 22, serving as the pull-up output transistor, can be increased to a voltage level that is higher than the output-stage operating voltage Vdd1 applied to the drain of the transistor 22 by approximately (Vt1−Vt2). Thus, a reduction in output signal amplitude from the level Vdd1 can be prevented.

As mentioned above, in the exemplary output circuit 20 shown in FIG. 1, in a manner similar to the output circuit 160 shown in FIG. 7, the operating voltage Vdd2 for the drive circuits 34 and 36 is lower than the power supply voltage Vdd, thus reducing the power consumption. In addition, the operating voltage Vdd2 of the pull-up drive circuit 34 is higher than the output-stage operating voltage Vdd1, thus preventing a reduction in output signal amplitude. Furthermore, the power consumption can be reduced, and the reduction in output signal amplitude can be prevented with a smaller circuit scale than the output circuit 160 shown in FIG. 7.

In addition, in the exemplary output circuit 20 shown in FIG. 1, the first NMOS transistor 22, serving as the pull-up output transistor, has the threshold voltage Vt2 that is lower than the threshold voltage Vt1 of the second NMOS transistor 24, serving as the pull-down output transistor. Thus, the reduction in output signal amplitude can be further prevented.

For example, when the source potential and the substrate potential are equal, the threshold voltage Vt2 of each of the first and fourth NMOS transistors 22 and 32 is equal to one half the threshold voltage Vt1 of the third NMOS transistor 26 or lower. The operating voltage Vdd2 of the pull-up drive circuit 34 can be higher than the output-stage operating voltage Vdd1 by the amount of Vt2 or more. Therefore, when an output of the pull-up drive circuit 34 can be increased to the drive-circuit operating voltage Vdd2, a voltage applied to the gate of the first NMOS transistor 22 can be higher than the output-stage operating voltage Vdd1 applied to the drain thereof by the amount of Vt2 or more.

Accordingly, assuming that the variation ΔVt2 in threshold voltage of the first NMOS transistor 22 caused by the potential difference between the source and the substrate can be ignored, a voltage at the output terminal OUT connected to the source of the first NMOS transistor 22 can be increased to the same level as that of the output-stage operating voltage Vdd1 applied to the drain of the transistor 22. In other words, an output signal with the same amplitude as that of the output-stage operating voltage Vdd1 can be obtained.

Actually, the variation ΔVt2 in threshold voltage of the first NMOS transistor 22 caused by the potential difference between the source and the substrate cannot be ignored. Therefore, the difference between the threshold voltages Vt1 and Vt2 may be further increased in order to obtain the same output signal amplitude as that of the output-stage operating voltage Vdd1. Specifically, as mentioned above, when the threshold voltage Vt1 is approximately equal to 0.7 V, the threshold voltage Vt2 is set to approximately 0.1 V. When the reference voltage Vr is properly set, therefore, a desired output signal amplitude can be obtained. For example, to obtain an output signal amplitude of approximately 1 V, the reference voltage Vr can be set to approximately 2 V.

In actuality, if Vt1=0.7 V, Vt2=0.1 V, and Vr=2.0 V in the output circuit 20 shown in FIG. 1, then when the power supply voltage Vdd is lowered, as long as Vdd is equal to 2.4 V or higher, an output signal amplitude of approximately 1 V can be held.

As mentioned above, in the exemplary output circuit 20 shown in FIG. 1, the threshold voltage of the fourth NMOS transistor 32, serving as the drive-circuit operating voltage supply source, is lower than the threshold voltage Vt1 of the third NMOS transistor 26, serving as the output-stage operating voltage supply source. Consequently, the pull-up drive circuit 34 receives the drive-circuit operating voltage Vdd2 that is higher than the output-stage operating voltage Vdd1 applied to the drain of the pull-up output transistor 22. In addition, the threshold voltage of the first NMOS transistor 22, serving as the pull-up output transistor, is lower than the threshold voltage Vt1 of the second NMOS transistor 22, serving as the pull-down output transistor.

Thus, as compared to a case where only the threshold voltage of the fourth NMOS transistor 32 is reduced, the reduction in output signal amplitude can be further prevented.

More specifically, in the exemplary output circuit 20 shown in FIG. 1, the threshold voltage of the first NMOS transistor 22 is equal to that of the fourth NMOS transistor 32. It is not indispensable that the threshold voltages of the first and fourth NMOS transistors 22 and 32 be equal. In order to set different threshold voltages as will be described below, however, an ion implantation process is performed twice, thus resulting in an increase in cost. To manufacture the circuit without increasing the cost, it is preferable that the threshold voltage of the first NMOS transistor 22 be equal to that of the fourth NMOS transistor 32.

However, it is generally not preferable that the threshold voltage Vt2 of the first and fourth NMOS transistors 22 and 32 be set to a lower value than necessary. For example, when the reference voltage Vr is fixed, as the threshold voltage Vt2 of the fourth NMOS transistor 32 is higher, the difference between the power supply voltage Vdd and the drive-circuit operating voltage Vdd2 applied to the drive circuits 34 and 36 is smaller. Unfortunately, the reduction in the power consumption is also reduced.

If the output of the drive circuit 34 goes to the low level in order to allow the output terminal OUT to output a low level signal synchronously with the reduction in threshold voltage Vt2 of the first NMOS transistor 22, the first NMOS transistor 22, serving as the pull-up output transistor, is not completely turned off. Thus the power consumption is increased. In particular, in a case where the threshold voltage Vt2 has a negative value, even when the enable signal is set to the high level so that the output terminal OUT enters the high impedance state, the pull-up output transistor 22 is held in the ON state. Disadvantageously, the output terminal cannot enter the high impedance state.

It is therefore preferable that the threshold voltage Vt2 of the first and fourth NMOS transistors 22 and 32 be set to 0 V or higher. Actually, in consideration of a fluctuation in threshold voltage caused by a manufacturing process, the threshold voltage Vt2 is preferably set so that the threshold voltage Vt2 does not have a negative value. Specifically, if the fluctuation in threshold voltage caused by the manufacturing process is within ±0.1 V, the threshold voltage Vt2 of the first and fourth NMOS transistors 22 and 32 is set to 0.1 V or higher.

As described in the above-mentioned reference 1, when the ion implantation process is performed twice in order to set difference threshold voltages, two kinds of NMOS transistors having different threshold voltages can be formed in the same substrate. Advantageously, the semiconductor integrated circuit 10 having the output circuit 20 shown in FIG. 1 according to various exemplary embodiments of the present invention can be manufactured with a lower cost than a semiconductor integrated circuit having the conventional output circuit 140.

In this case, for example, the second and third NMOS transistors 24 and 26 are formed together with the other NMOS transistors used in the semiconductor integrated circuit 10 by ion implantation for threshold voltage setting. There is no consideration of a change in threshold voltage depending on the size of the transistor. Therefore, the second and third NMOS transistors 24 and 26 and the other NMOS transistors used in the semiconductor integrated circuit 10 have the same threshold voltage. Regarding the threshold voltage of the first and fourth NMOS transistors 22 and 32, similarly, when there is no consideration of a change in threshold voltage depending on the size of the transistor, the second and fourth NMOS transistors 22 and 32 have the same threshold voltage.

Figure 2:
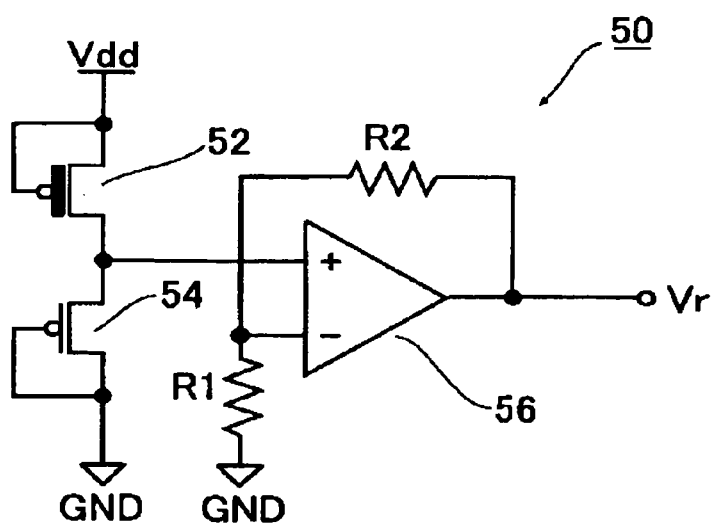
FIG. 2 shows an example of a reference voltage generating circuit (reference voltage source) used together with the output circuit of FIG. 1.

FIG. 2 shows a circuit diagram of an example of the reference voltage source 50 for generating the reference voltage Vr to be applied to the output-stage operating voltage supply source and the drive-circuit operating voltage supply source of the output circuit 20 shown in FIG. 1.

Referring to FIG. 2, the reference voltage source 50 includes first and second P-channel MOS (PMOS) transistors 52 and 54, an operational amplifier 56, and resistors R1 and R2. The first PMOS transistor 52 has a positive threshold voltage. The second PMOS transistor 54 has a negative threshold voltage.

The gate and source of the first PMOS transistor 52 are connected to the power supply Vdd. The gate and source of the second PMOS transistor 54 are connected to the GND. The drain of each of the first and second PMOS transistors 52 and 54 is connected to a non-inverting input terminal of the operational amplifier 56. Accordingly, a predetermined voltage determined by the difference in threshold voltage between the first and second PMOS transistors 52 and 54 is supplied to the non-inverting input terminal of the operational amplifier 56.

The resistor R1 is arranged between the GND and an inverting input terminal of the operational amplifier 56. The resistor R2 is arranged between the inverting input terminal and an output terminal of the operational amplifier 56. Consequently, the operational amplifier 56 outputs the reference voltage Vr from the output terminal. The reference voltage Vr is determined on the basis of a voltage at the non-inverting input terminal determined depending on the difference in threshold voltage between the first and second PMOS transistors and the ratio of the resistance R1 to the resistance R2.

The first and second PMOS transistors 52 and 54 having different threshold voltages can be formed by the same method as that for forming NMOS transistors having different threshold voltages. In other words, the ion implantation process for threshold voltage setting is performed twice. Thus, the first and second PMOS transistors can be formed in the same semiconductor substrate without increasing the manufacturing cost.

The reference voltage source 50 shown in FIG. 2 merely generates the reference voltage Vr that is lower than the power supply voltage Vdd. As mentioned above, it has been confirmed that even when the power supply voltage Vdd is lowered, as long as Vdd is equal to or higher than 2.4 V, the reference voltage source 50 can supply a reference voltage of 2 V.

According to an exemplary embodiment of the present invention, the integrated circuit does not indispensably require the reference voltage source 50 shown in FIG. 2. For example, various reference voltage sources, such as, a reference voltage source using a band gap reference, can be used. Further, a reference voltage source may be externally attached to the semiconductor integrated circuit such that the reference voltage Vr is externally applied to the integrated circuit.

Figure 3:
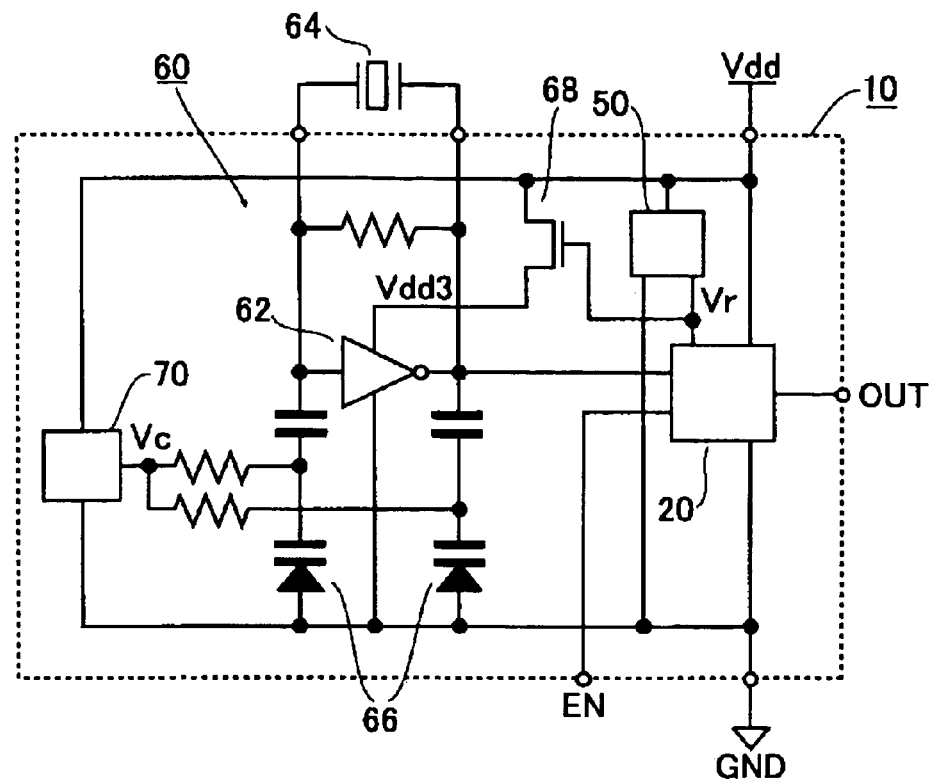
FIG. 3 shows an example of the semiconductor integrated circuit according to an exemplary embodiment of the present invention.
Figure 4:
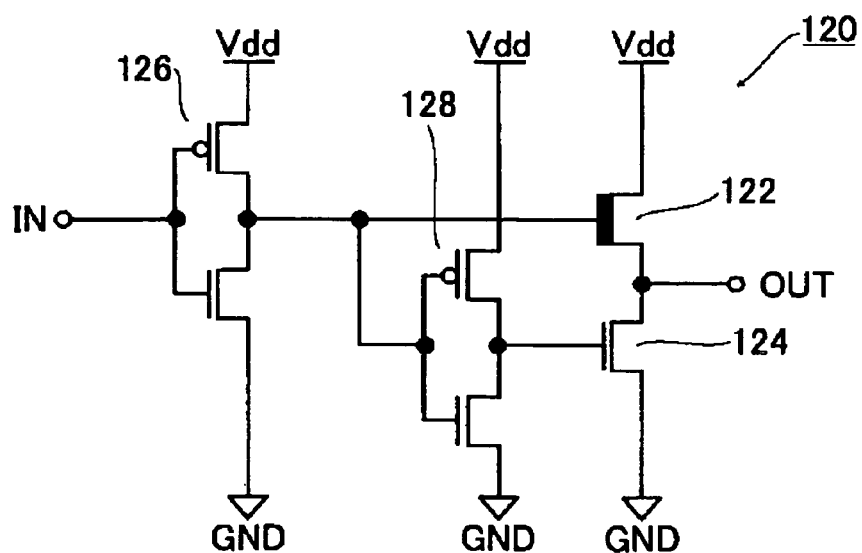
FIG. 4 shows an example of an output circuit of a related art for a CMOS logic integrated circuit.
Figure 5:
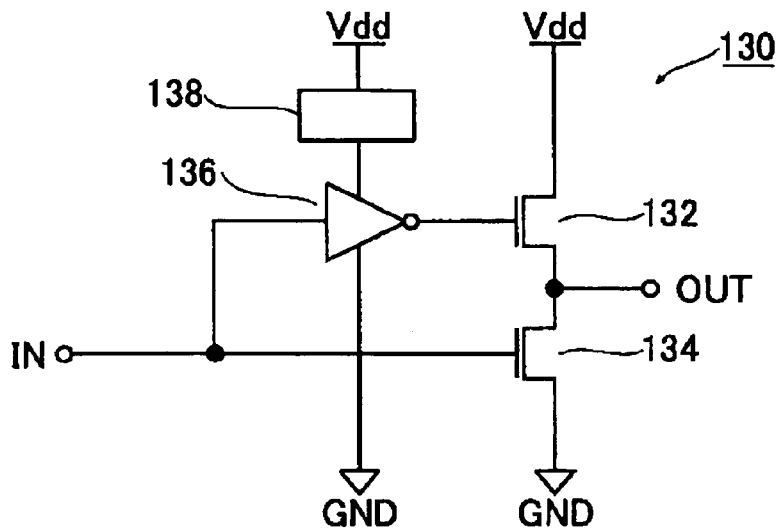
FIG. 5 shows an example of another output circuit of a related art for the CMOS logic integrated circuit.

FIG. 3 shows an example of the semiconductor integrated circuit 10 including the output circuit 20 shown in FIG. 1 according to an exemplary embodiment of the present invention. FIG. 3 shows the integrated circuit 10 for a TCXO. A quartz crystal 64 is connected to the semiconductor integrated circuit 10. The power supply voltage Vdd and the ground voltage GND are applied to the semiconductor integrated circuit 10. Consequently, the semiconductor integrated circuit 10 outputs a fixed-frequency temperature-compensated output signal from an output terminal OUT.

Referring to FIG. 3, the semiconductor integrated circuit 10 includes, for example, the output circuit 20 as shown in FIG. 1, and the reference voltage source 50 as shown in FIG. 2.

The semiconductor integrated circuit 10 shown in FIG. 3 further includes an oscillating circuit 60, a fifth NMOS transistor 68, and a temperature-compensated voltage generator 70. The oscillating circuit 60 is a voltage controlled oscillator (VCO) that includes an inverter 62, two variable capacitance diodes 66, a resistor, capacitors, and the externally attached quartz crystal 64. The temperature-compensated voltage generator 70, that includes thermo-sensitive devices, such as a junction diode and a thermistor, applies a compensated voltage Vc to the variable capacitance diodes 66 of the oscillating circuit 60, so that a fixed-frequency temperature-compensated signal is generated.

An oscillating-circuit operating voltage supply source, including the fifth NMOS transistor 68, applies an oscillating-circuit operating voltage Vdd3 to the inverter 62 of the oscillating circuit 60. Consequently, fluctuations in oscillating frequency caused by fluctuations in power supply voltage Vdd applied to the integrated circuit 10 can be prevented. The oscillating-circuit operating voltage Vdd3 can be generated using the same reference voltage Vr as that applied to the output circuit 20. In other words, the integrated circuit 10 for TCXO in FIG. 3 needs only one reference voltage source 50.

The semiconductor integrated circuit according to an exemplary embodiment of the present invention and the output circuit included therein have been instantiated. It should be understood that the present invention is not limited to those examples but many modifications and variations are possible.

For example, in the output circuit 20 shown in FIG. 1, the drive-circuit operating voltage Vdd2 that is lower than the power supply voltage Vdd and is higher than the output-stage operating voltage Vdd1 is applied to each of the three CMOS gates 34a to 34c, constituting the pull-up drive circuit 34, and the two CMOS gates 36a and 36b, constituting the pull-down drive circuit 36. However, it is not indispensable for the output circuit according to an exemplary embodiment of the present invention.

In other words, in the drive circuits 34 and 36, the components that consume maximum power are the inverters 34c and 36b. Each of the inverter 34c and 36b serve as the final-stage CMOS gate, for outputting the drive signal and the inverted drive signal to the gates of the output transistors 22 and 24, respectively. Therefore, when an operating voltage lower than the power supply voltage Vdd is applied to the final-stage inverters 34c and 36b, the power consumption can be reduced to some extent.

Only the inverter 34c, serving as the final-stage CMOS gate of the pull-up drive circuit 34, requires the supply of the drive-circuit operating voltage Vdd2 that is higher than the output-stage operating voltage Vdd1 in order to increase the gate voltage of the first NMOS transistor 22, serving as the pull-up output transistor, higher than the drain voltage to prevent a reduction in output amplitude. A different operating voltage can be applied to the other stages of the pull-up drive circuit 34 and the pull-down drive circuit 36. For example, a voltage that is equal to or lower than the output-stage operating voltage Vdd1 can be applied to the other stages of the pull-up drive circuit 34 and the pull-down drive circuit 36. Thus, the power consumption can be further reduced.

What is claimed is:

1. A semiconductor integrated circuit that operates with a power-supply voltage and comprises an output circuit, the output circuit comprising:
   a driving circuit that receives an input signal and that generates a driving signal and an inverted drive signal, the driving circuit including an CMOS gate that operates with a driving circuit operating voltage that is lower than the power-supply voltage and outputs the driving signal;
   an output stage having an output terminal that outputs an output signal, the output stage including a first and a second N-channel MOS transistor, the first N-channel MOS transistor having a drain thereof that receives an output stage operating voltage that is lower than the driving circuit operating voltage, a source thereof connected to the output terminal, and a gate thereof that receives the driving signal, the second N-channel MOS transistor having a source thereof connected to a ground, a drain thereof connected to the output terminal, and a gate thereof that receives the inverted driving signal;
   an output stage operating voltage source that supplies the output stage operating voltage, the output stage operating voltage source including a third N-channel MOS transistor having a first positive threshold voltage, the third N-channel MOS transistor further having a drain thereof that receives the power-supply voltage, a gate thereof that receives a reference voltage, and a source thereof that outputs the output stage operating voltage; and
   a driving circuit operating voltage source that supplies the driving circuit operating voltage, the driving circuit operating voltage source including a fourth N-channel MOS transistor having a second threshold voltage lower than the first threshold voltage, the fourth N-channel MOS transistor further having a drain thereof that receives the power-supply voltage, a gate thereof that receives the reference voltage, and a source thereof that outputs the driving circuit power supply voltage.

2. The semiconductor integrated circuit according to claim 1, wherein the first N-channel MOS transistor has a third threshold voltage lower than a threshold voltage of the second N-channel MOS transistor.

3. The semiconductor integrated circuit according to claim 2, wherein the second and the third threshold voltages are equal and the second and the third threshold voltages are not higher than one-half the first threshold voltage.

4. The semiconductor integrated circuit according to claim 2, wherein the third threshold voltage is not lower than about 0 V.

5. A semiconductor integrated circuit, comprising:
   an oscillator circuit that operates with an oscillator circuit operating voltage lower than the power-supply voltage and outputs an oscillation signal;
   an oscillator circuit operating voltage source that receives a reference voltage and supplies the oscillation circuit operating voltage;
   a driving circuit that receives the oscillation signal and generates a driving signal and an inverted drive signal, the driving circuit including an CMOS gate that operates with a driving circuit operating voltage that is lower than the power-supply voltage and outputs the driving signal;
   an output stage having an output terminal that outputs an output signal, the output stage including a first and a second N-channel MOS transistor, the first N-channel MOS transistor having a drain thereof that receives an output stage operating voltage that is lower than the driving circuit operating voltage, a source thereof connected to the output terminal, and a gate thereof that receives the driving signal, the second N-channel MOS transistor having a source thereof connected to a ground, a drain thereof connected to the output terminal, and a gate thereof that receives the inverted driving signal;
   an output stage operating voltage source that supplies the output stage operating voltage, the output stage operating voltage source including a third N-channel MOS transistor having a first positive threshold voltage, the third N-channel MOS transistor further having a drain thereof that receives the power-supply voltage, a gate thereof that receives the reference voltage, and a source thereof that outputs the output stage operating voltage; and a driving circuit operating voltage source that supplies the driving circuit operating voltage, the driving circuit operating voltage source including a fourth N-channel MOS transistor having a second threshold voltage that is lower than the first threshold voltage, the fourth N-channel MOS transistor further having a drain thereof that receives the power-supply voltage, a gate thereof that receives the reference voltage, and a source thereof that outputs the driving circuit power supply voltage.

6. The semiconductor integrated circuit according to claim 5, wherein the oscillator circuit is a temperature-compensated crystal oscillator.

7. The semiconductor integrated circuit according to claim 5, wherein the first N-channel MOS transistor has a third threshold voltage that is lower than a threshold voltage of the second N-channel MOS transistor.

8. The semiconductor integrated circuit according to claim 7, wherein the second and third threshold voltages are equal and are not higher than one-half the first threshold voltage.

9. The semiconductor integrated circuit according to claim 7, wherein the third threshold voltage is not lower than about 0 V.

10. A semiconductor integrated circuit that operates with a power-supply voltage and comprises an output circuit, the output circuit comprising:
  a driving circuit that receives an input signal and generates a driving signal and an inverted drive signal, the driving circuit including a CMOS gate that operates with a driving circuit operating voltage and outputs the driving signal;
  an output stage having an output terminal that outputs an output signal, the output stage including a first and a second N-channel MOS transistor, the first N-channel MOS transistor having a drain thereof that receives an output stage operating voltage, a source thereof connected to the output terminal, and a gate thereof that receives the driving signal, the second N-channel MOS transistor having a source thereof connected to a ground, a drain thereof connected to the output terminal, and a gate thereof that receives the inverted driving signal, wherein:
  an amplitude of the output signal is reduced by supplying the output stage operating voltage lower than the power-supply voltage from an output stage operating voltage source to the output stage, the output stage operating voltage source including a third N-channel MOS transistor having a first positive threshold voltage, the third N-channel MOS transistor having a drain thereof that receives the power-supply voltage, a gate thereof that receives a reference voltage, and a source thereof that outputs the output stage operating voltage; and
  an excessive reduction of the amplitude of the output signal is prevented by supplying the driving circuit operating voltage that is lower than the power-supply voltage but higher than the output stage operating voltage from a driving circuit operating voltage source to the driving circuit, the driving circuit operating voltage source including a fourth N-channel MOS transistor having a second threshold voltage that is lower than the first threshold voltage, the fourth N-channel MOS transistor having a drain thereof that receives the power-supply voltage, a gate thereof that receives the reference voltage, and a source thereof that outputs the driving circuit power supply voltage.

11. The semiconductor integrated circuit according to claim 10, wherein the excessive reduction of the amplitude of the output signal is further prevented by making the first N-channel MOS transistor have a third threshold voltage that is lower than a threshold voltage of the second N-channel MOS transistor.

12. The semiconductor integrated circuit according to claim 11, wherein the second and third threshold voltages are equal and are not higher than one-half the first threshold voltage.

13. The semiconductor integrated circuit according to claim 11, wherein the third threshold voltage is not lower than about 0 V.

* * * * *